United States Patent [19]
Kim

[11] Patent Number: 6,104,736
[45] Date of Patent: Aug. 15, 2000

[54] DRIVING APPARATUS FOR SEMICONDUCTOR LASER AND METHOD FOR CONTROLLING DRIVING OF SEMICONDUCTOR LASER

[75] Inventor: Kweon Kim, Tokyo, Japan

[73] Assignee: Oki Electric Industry Co., Ltd., Tokyo, Japan

[21] Appl. No.: 09/037,760

[22] Filed: Mar. 10, 1998

[30] Foreign Application Priority Data

Mar. 11, 1997 [JP] Japan ..................................... 9-055710

[51] Int. Cl.$^7$ ...................................................... H01S 3/00
[52] U.S. Cl. ................................ 372/38; 372/100; 372/92
[58] Field of Search ................................. 372/92, 29, 31, 372/38, 100, 18

[56] References Cited

U.S. PATENT DOCUMENTS 3,611,436  10/1971  Rigrod ........................................ 372/92

*Primary Examiner*—Leon Scott, Jr.
*Attorney, Agent, or Firm*—Venable

[57] ABSTRACT

Driving current in sine wave form is supplied to a semiconductor laser; the laser beam output by this semiconductor laser is caused to split into two laser beams for measurement which mutually interfere after passing through optical paths with different optical lengths. Then, the light intensity of the laser beams for measurement after interference is detected with the means for detecting light; after the high frequency component is extracted from the detection signal of this means for detecting light, bias current applied to the driving current is controlled so that the light intensity of this high frequency component becomes a maximum value.

12 Claims, 6 Drawing Sheets

DRIVING APPARATUS FOR SEMICONDUCTOR LASER AND METHOD FOR CONTROLLING DRIVING OF SEMICONDUCTOR LASER

BACKGROUND OF THE INVENTION

1. Field of the Invention

The present invention relates to a driving apparatus for controlling the frequency of a laser beam output from a semiconductor laser, and more particularly to a driving apparatus to generate frequency modulated waves using the semiconductor laser.

2. Description of the Related Art

Before now, it has been difficult to attain frequency modulated waves using a laser beam generated by a semiconductor laser. This is because of the variation among semiconductor laser elements in their current-oscillation frequency characteristics and also because of the great temperature dependence of these current-oscillation frequency characteristics.

For this reason, modulation systems for phase modulation and so forth, specifically modulation systems excluding frequency modulation, have been employed up to now as modulation systems in optical communications, and so forth.

FIG. 5 is a graph showing roughly the current-oscillation frequency characteristics of semiconductor lasers. In FIG. 5, the horizontal axis shows the current supplied to the semiconductor laser and the vertical axis shows the oscillation frequency of the semiconductor laser.

As understood from FIG. 5, the oscillation frequency of the laser beam decreases as the current supplied to the semiconductor laser increases. Here, as shown in FIG. 5, this oscillation frequency deviates in a roughly linear manner in relation to the supplied current, but it shifts abruptly at certain specific current values $i_1, i_2, i_3, \ldots$ The current value supplied to the semiconductor laser may be changed in order to effect frequency modulation of a laser beam output from this semiconductor laser.

Here, in order to attain a good frequency modulated wave, the oscillation frequency must be changed only in the regions where the current dependence of the oscillation frequency (relationship of the current value variation $\Delta i$ and the oscillation frequency variation $\Delta f$) becomes linear. Consequently, the current value supplied to the semiconductor laser must be varied only in the regions of $A_1, A_2, \ldots$ in FIG. 5.

On the other hand, when the current values $i_1, i_2, i_3, \ldots$ are included in the variable range of the current value (see symbols $B_1, B_2, B_3, \ldots$ in FIG. 5), the oscillation frequency shifts abruptly at these current values $i_1, i_2, i_3, \ldots$; therefore, the relationship of the current value variation $\Delta i$ and the oscillation frequency variation $\Delta f$ does not become linear. Consequently, demodulation of the modulated wave attained in this way becomes very difficult. For this reason, in the case where the laser beam output from the semiconductor laser is to be frequency modulated, the current values included in the ranges $B_1, B_2, B_3, \ldots$ in FIG. 5 (specifically current values $i_1, i_2, i_3, \ldots$ and current values in the vicinity thereof) must not be used.

The current values $i_1, i_2, i_3, \ldots$, where the oscillation frequency shifts abruptly, differ among the semiconductor laser elements. Also these current values $i_1, i_2, i_3, \ldots$ vary greatly depending on temperature.

FIG. 6 is a graph showing roughly the temperature dependence of the current-oscillation frequency characteristics of semiconductor lasers. As shown in FIG. 6, the current values $i_1, i_2, i_3, \ldots$, where the oscillation frequency shifts abruptly, shift to the right (specifically, the direction in which the current values $i_1, i_2, i_3, \ldots$ rise) as the temperature of the semiconductor laser elements rises.

For the reasons explained above, in the case of frequency modulation of a laser beam output from a semiconductor laser, the ranges of current used must be determined in consideration of both the current-oscillation frequency characteristics of each semiconductor laser element and the temperature dependence of these current-oscillation frequency characteristics.

For this reason, driving control becomes very complex and large scale, thereby becoming an obstacle to realizing frequency modulation using semiconductor lasers.

SUMMARY OF THE INVENTION

It is an object of the present invention to provide a driving apparatus for semiconductor laser and method for controlling driving able to determine, simply and with small scale control, the current values supplied to an semiconductor laser.

For this reason, the driving apparatus for semiconductor laser relating to the present invention comprises: means for generating modulation frequency to supply driving current to this semiconductor laser in order to control frequency modulation of a laser beam output by an semiconductor laser; an interference optical system for causing the laser beam to split into two laser beams for measurement and for guiding the two laser beams for measurement so they mutually interfere after passing through optical paths with different optical lengths; means for detecting light to detect the light intensity of the laser beams for measurement after interference; means for detecting a high frequency component to extract the high frequency component from the detection signal of the means for detecting light; and means for applying bias current to control the bias current applied to the driving current so that the light intensity, of the high frequency component detected by the means for detecting a high frequency component, becomes the maximum value.

The present invention makes it possible to realize good frequency modulation just by extracting the high frequency component from the value detected of the means for detecting light and controlling bias current so that the light intensity of the high frequency component becomes the maximum value. In other words, the current value supplied to the semiconductor laser can be determined by simple and small scale control with the present invention.

Also, the method for controlling driving of the semiconductor laser relating to the present invention comprises: a process for supplying driving current of an arbitrary frequency to a semiconductor laser; a process for causing the laser beam output by the aforementioned semiconductor laser to split into two laser beams for measurement and causing the [two laser beams for measurement] to interfere with each other after passing through optical paths with different optical lengths; a process for detecting the light intensity of the aforementioned laser beam for measurement after interference with means for detecting light; a process for extracting the high frequency component from the detection signal of the means for detecting light; and a process for controlling the bias current applied to the aforementioned driving current.

The present invention makes it possible to realize good frequency modulation just by extracting the high frequency component from the value detected by the means for detecting light and controlling bias current so that the light intensity of the high frequency component becomes the maximum value. In other words, the current value supplied to the semiconductor laser can be determined by simple and small scale control with the present invention.

BRIEF DESCRIPTION OF THE DRAWINGS

The foregoing and other objects, features and advantages of the present invention will be better understood from the following description with the accompanying drawings, in which.

DESCRIPTION OF THE PREFERRED EMBODIMENTS

Below, an embodiment of the present invention is explained using the drawings. Moreover, it should be recognized that the figures show the size, form, and positional relationships of each structural component in an approximate manner so that the present invention can be understood, and that the numerical conditions explained below are only simple examples.

Figure 1:
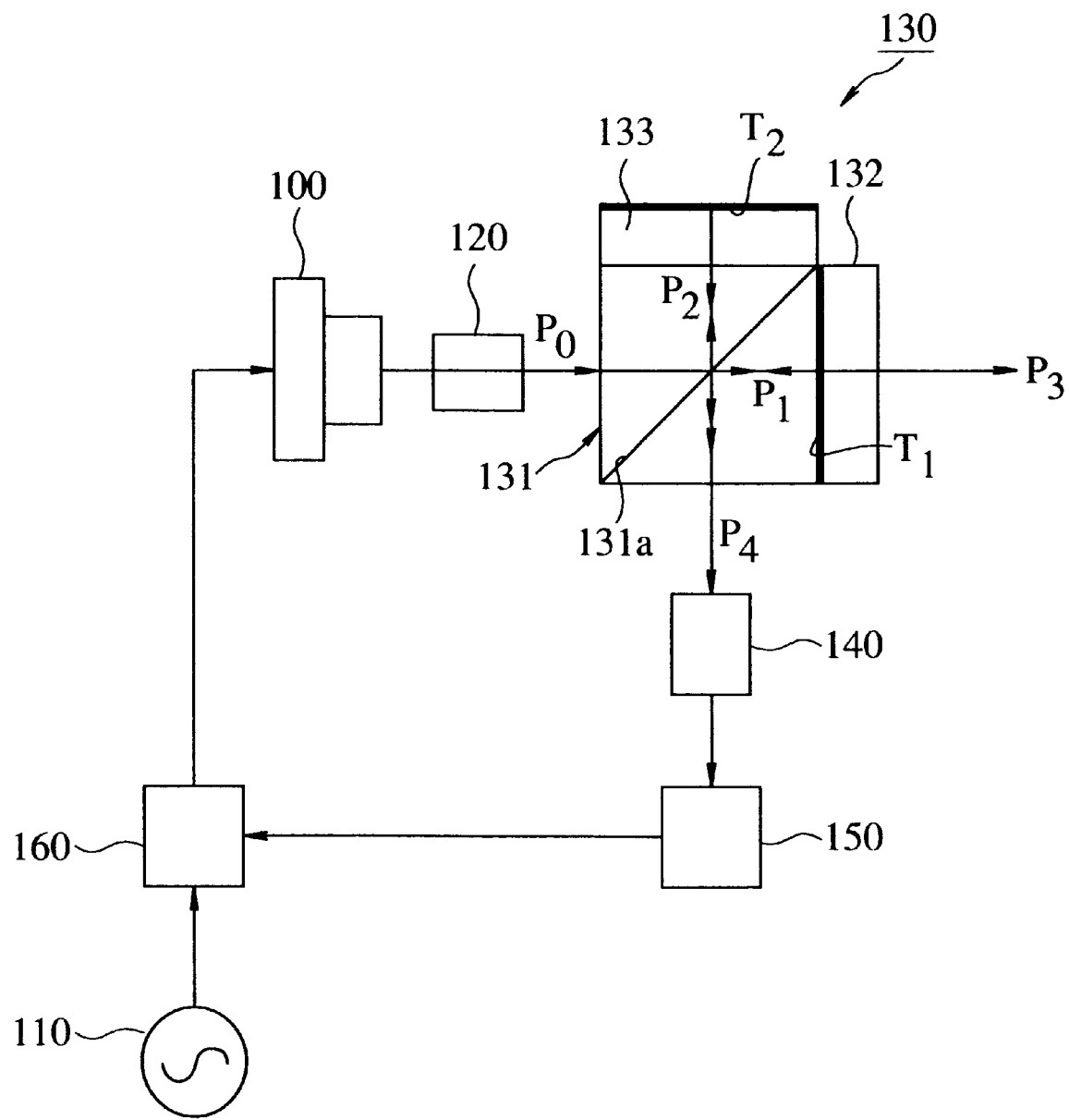
FIG. 1 is an outline showing the constitution of the driving apparatus of a semiconductor laser relating to an embodiment of the present invention.

FIG. 1 is an outline showing the constitution of the driving apparatus of a semiconductor laser relating to an embodiment of the present invention.

Figure 5:
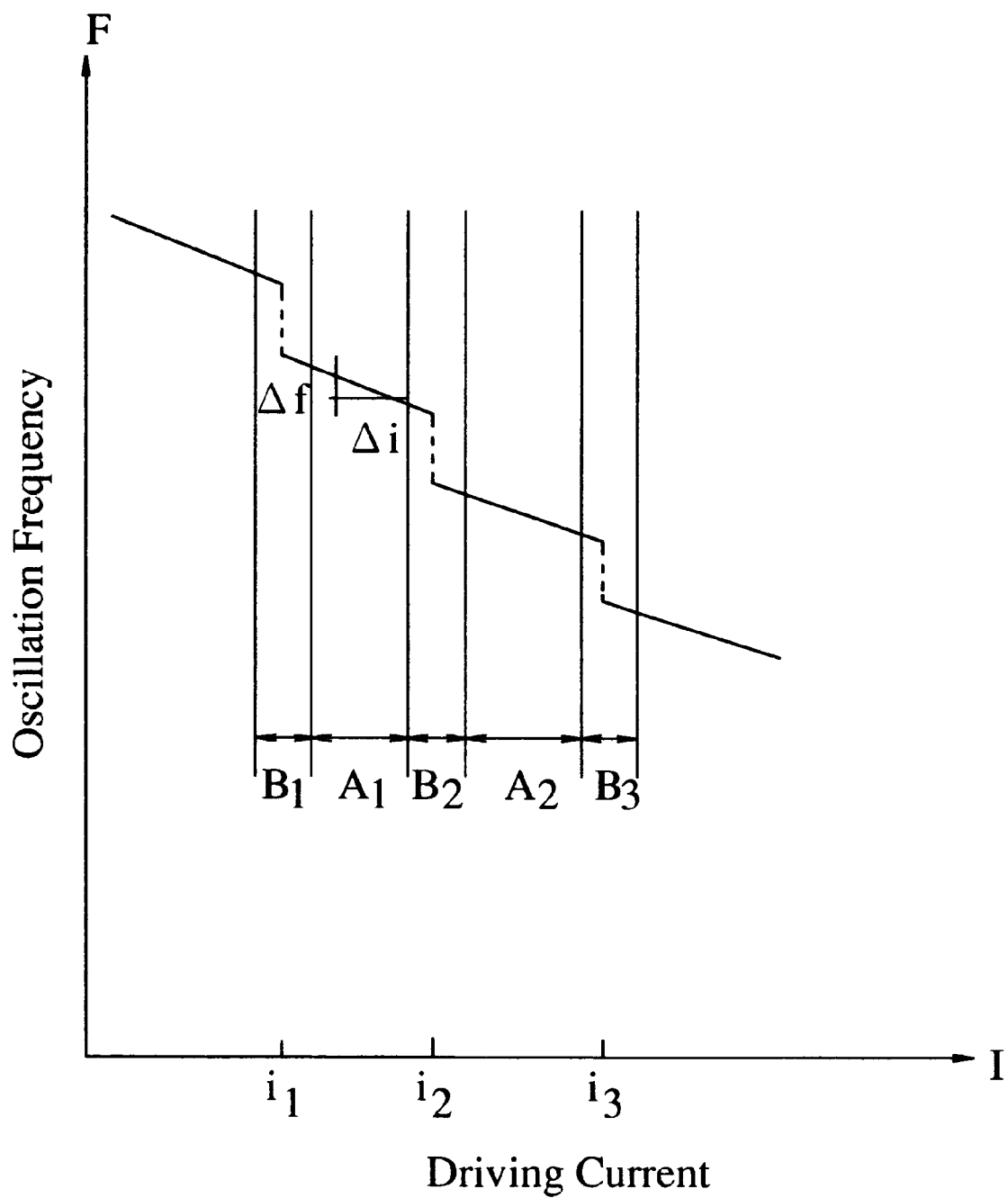
FIG. 5 is a graph showing the current-oscillation frequency characteristics of a semiconductor laser.
Figure 6:
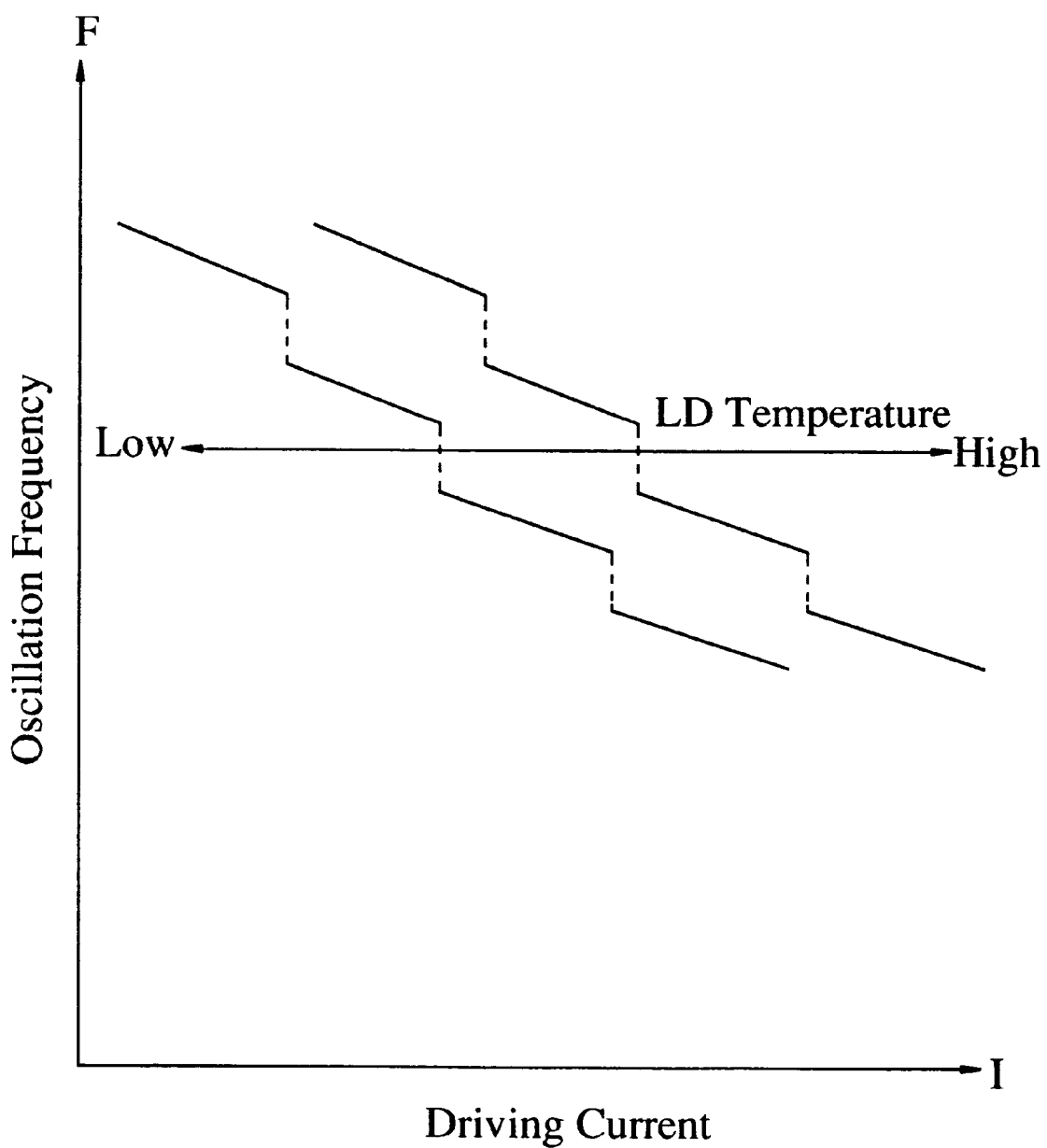
FIG. 6 is a graph showing the temperature dependence of the current-oscillation frequency characteristics of a semiconductor laser.

In FIG. 1, a semiconductor laser which is the same as a conventional semiconductor laser, specifically a semiconductor laser having the current-oscillation frequency characteristics as shown in FIG. 5, is used as the semiconductor laser 100.

A modulation frequency generating portion 110 generates a driving current of an arbitrary frequency and supplies this driving current to the semiconductor laser 100.

A lens 120 is emplaced on the optical path of the laser beam $P_0$ output from the semiconductor laser 100 and is used to make this laser beam $P_0$ a parallel beam.

An interference optical system 130 comprises a cube mirror 131, a first half-silvered mirror 132, and a second half-silvered mirror 133.

The cube mirror 131 is constituted of two prisms joined at a junction plane 131a and the entirety thereof forms a cube. This cube mirror 131 is positioned on the optical path of the laser beam $P_0$ so as to cause this laser beam $P_0$ to split into a straight beam $P_1$ and reflected beam $P_2$ at right angles to this straight beam $P_1$. In this embodiment, the cube mirror 131 is positioned so that the laser beam $P_0$ strikes the junction plane 131a at a 450° angle of incidence.

Also, the first half-silvered mirror 132 is mounted on the surface of the cube mirror 131 from which the straight beam $P_1$ exits. Also, this first half-silvered mirror 132 is positioned so that the reflecting surface $T_1$ contacts the exit surface of the cube mirror 131.

The second half-silvered mirror 133 is mounted on the surface of the cube mirror 131 from which the reflected beam $P_2$ exits. Also, this second half-silvered mirror 133 is positioned so that the surface opposite the reflecting surface $T_2$ contacts the exit surface of the cube mirror 131. Moreover, in this embodiment, a mirror which is optically identical (specifically, a mirror with the same thickness and reflectance) to the first half-silvered mirror 132 is used as the second half-silvered mirror 133, in order to simplify manufacturing.

A light detector 140 is placed at a position opposite to the second half-silvered mirror via the cube mirror 131. Thereby, as discussed below, it is possible to detect the light intensity of the interference beam of the beam reflected by the first half-silvered mirror 132 and the beam reflected by the second half-silvered mirror 133.

A high frequency component detecting portion 150 extracts and outputs the high frequency component from the detection signal of the light detector 140.

A bias current applying portion 160 applies bias current to the driving current output from the modulation frequency generating portion 110. The value of this bias current is controlled by the bias current applying portion 160 so that the high frequency component extracted by the high frequency component detecting portion 150 is the maximum value.

Next, the operation of the driving apparatus of the semiconductor laser 100 shown in FIG. 1 is explained.

In the driving apparatus relating to this embodiment, the value of the bias current output by the bias current applying portion 160 is established, as below, as an initial setting for frequency modulation of laser beam output by the semiconductor laser 100.

The modulation frequency generating portion 110 generates a driving sine wave current and supplies the sine wave current to the semiconductor laser 100 as driving current. Thereby, the semiconductor laser 100 outputs laser beam $P_0$ having a frequency corresponding to the driving current. In this initial setting, a periodically varying frequency (specifically, the frequency changes in a sine wave form) is used as the driving current. As shown in FIG. 5, the oscillation frequency of the semiconductor laser 100 depends on the driving current value; therefore, laser beam $P_0$, where the oscillation frequency varies periodically, can be attained when driving current with a prescribed frequency is supplied to the semiconductor laser 100.

This laser beam $P_0$ is converted to a parallel beam with the lens 120 and strikes the cube mirror 130. Then part of this laser beam $P_0$ advances straight through the junction plane 131a of the cube mirror 131 and becomes the laser beam $P_1$; the rest of the laser beam $P_0$ is reflected by the junction plane 131a and becomes the laser beam $P_2$. In other words, as discussed above, the cube mirror 131 causes the laser beam $P_0$ to split into a straight laser beam $P_1$ and a laser beam $P_2$ which travels at right angles to the laser beam $P_1$.

The laser beam $P_1$ strikes the half-silvered mirror 132. Then, part of this laser beam $P_1$ is reflected by the reflecting surface $T_1$ of the half-silvered mirror 132 and the rest continues to travel in the same direction to become the laser beam $P_3$. This laser beam $P_3$ is used as the frequency modulated wave output after this initial setting, but is not used in this initial setting.

Also the laser beam $P_2$ strikes the half-silvered mirror 133. Then, part of this laser beam P2 is reflected by the reflecting surface $T_2$ of the half-silvered mirror 132 and the rest continues to travel in the same direction (not pictured).

Part of the laser beam $P_1$ reflected by the half-silvered mirror 132 is reflected by the junction plane 131a of the cube mirror 131 and moves in the direction of the light detector 140. Also, part of the laser beam $P_2$ reflected by the half-silvered mirror 133 travels straight into the cube mirror 131 and moves in the direction of the light detector 140. Then, these laser beams $P_1$, $P_2$ interfere in the vicinity of the junction plane 131a of the cube mirror 131 and the interference beam $P_4$ attained thereby strikes the light detector 140.

As discussed above, the reflecting surface $T_1$ of the first half-silvered mirror 132 contacts the cube mirror 131; meanwhile, the surface of the second half-silvered mirror 133 opposite the reflecting surface $T_2$ contacts the cube mirror 131. Consequently, the difference between the optical paths of the laser beams $P_1$, $P_2$, after splitting at the junction plane 131a of the cube mirror 131 until reaching the junction plane 131a again, becomes twice thickness of the half-silvered mirror 133. In other words, the necessary time after splitting at the junction plane 131a and until reaching the junction plane 131a again is different for the laser beam $P_1$ and the laser beam $P_2$. As discussed above, the frequency of the laser beam $P_0$ (and consequently $P_1$, $P_2$) varies periodically. For this reason, the frequencies of the laser beams $P_1$, $P_2$, when interfering in the vicinity of the junction plane 131a become different values. Specifically, the light $P_4$ attained from this interference includes a modulation frequency portion. Moreover, for reasons discussed below, this modulation frequency portion becomes the maximum when the driving current supplied to the semiconductor laser 100 falls within any of the ranges $A_1$, $A_2$, ... in FIG. 5 and becomes zero when the driving current falls within any of the ranges $B_1$, $B_2$, $B_3$, ....

The method for causing the interference of the two types of waves with different frequencies is generally called the heterodyne interference method. In other words, this heterodyne interference method is used in the present invention for controlling the driving of the semiconductor laser 100.

The interference beam $P_4$ is received by the light detector 140. Then this light detector 140 outputs an output voltage proportional to the light intensity of the interference beam $P_4$ as the detection signal. This detection signal includes the aforementioned modulation frequency portion as the high frequency component.

The high frequency component detecting portion 150 extracts the high frequency component (specifically the modulation frequency portion) from the detection signal of the light detector 140. Then a signal showing the value of this high frequency component is output to the bias current applying portion 160.

As discussed above, the bias current applying portion 160 controls the value of the bias current applied to the driving current so that the aforementioned high frequency component becomes the maximum value. Thereby, the driving current of the semiconductor laser 100 varies within any of the ranges $A_1$, $A_2$, ... in FIG. 5.

When the value of the bias current output by the bias current applying portion 160 is determined in this way, the bias current applying portion 160 then fixes the bias current to this determined value.

Afterwards, the laser beam output by the semiconductor laser 100 is frequency modulated through the control of the modulation frequency generating portion 110 in the state where the bias current is fixed. As discussed above, laser beam $P_3$ is used as the frequency modulated wave output. At this time, the driving current of the semiconductor laser 100 varies within any of the ranges $A_1$, $A_2$, ... in FIG. 5, therefore stable frequency modulation becomes possible.

Next is an explanation of the reason why the modulation frequency portion of the interference beam $P_4$ becomes the maximum when the driving current varies within any of the ranges $A_1$, $A_2$, ... in FIG. 5.

Figure 2:
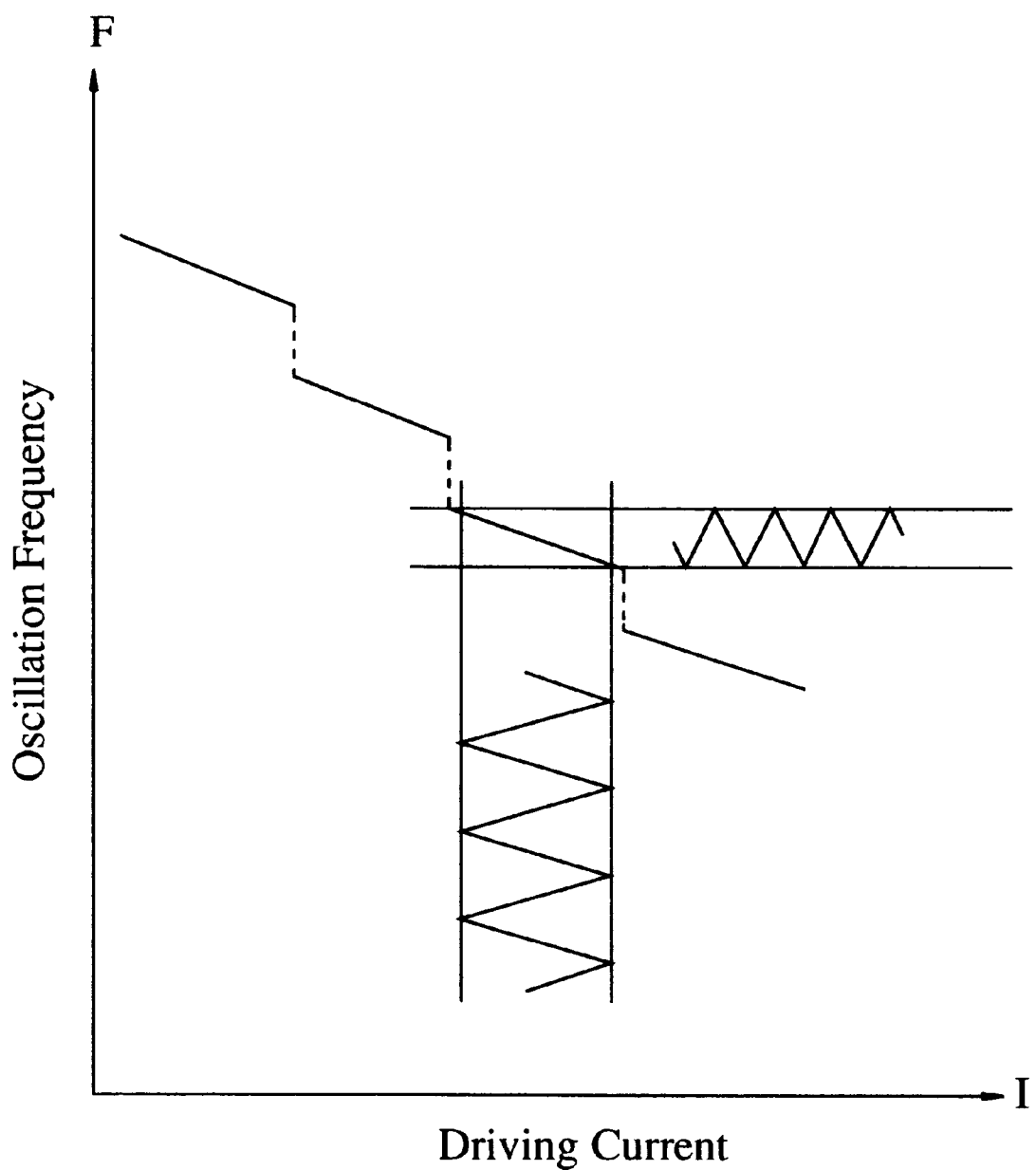
FIGS. 2 through 4 are drawings to explain the operating principle of the driving apparatus of a semiconductor laser relating to an embodiment of the present invention.

As shown in FIG. 2, the oscillation frequency of the semiconductor laser 100 is also sine wave modulated in the case where the modulation frequency generating portion 110 effects sine wave modulation when the driving current supplied to the semiconductor laser 100 is within any of the ranges $A_1$, $A_2$, ... (see FIG. 5). Then, the light intensity I, detected by the light detector 140 at this time, is expressed with the following formula (1).

$$I = I_{dc} + I_0 \cos(\phi + Z \sin \omega_m t) \tag{1}$$

In the above formula (1), ($\omega_m$ is the modulation angular frequency. Also, $\phi$ is the phase difference between beams $P_1$ and $P_2$; Z is the phase modulation amplitude of beams $P_1$ and $P_2$; $I_{dc}$ is the direct current component of the detected light; $I_0$ is the beat signal; these are expressed with formulas (1a) to (1d) below.

$$\phi = \frac{\omega_0 \cdot L}{c} \tag{1a}$$

$$Z = \frac{2\pi \cdot \delta \cdot L}{c} \tag{1b}$$

$$I_{dc} = a(P_1 + P_s) \tag{1c}$$

$$I_{dc} = 2a \cdot V \sqrt{P_1 + P_s} \tag{1d}$$

In these formulas (1a) to (1d), $\omega_0$ is the central angular frequency of the laser beam $P_0$ (and consequently beams $P_1$ and $P_2$) output by the semiconductor laser 100; L is the optical path difference of beams $P_1$ and $P_2$; c is the speed of light; $\delta$ is the frequency modulation amplitude; a is the constant depending on the light detector 140; $P_1$ is the power of the reference beam; $P_s$ is the power of the signal beam; and V is brightness.

Here, when $I_0(t)$ is the result of Fourier transformation of the beat signal $I_0$ in relation to the modulation angular frequency $\omega_m$, $I_0(t)$ is expressed with the following formula (2).

$$I_0(t) = I_0 \left[ \cos\phi \left\{ j_0(Z) + 2\sum_{k=1}^{\infty} J_{2k}(Z) \cdot \cos 2k\omega_m \cdot t \right\} + \sin\phi \left\{ 2\sum_{k=1}^{\infty} J_{2k-1}(Z) \sin(2k-1) \cdot \omega_m \cdot t \right\} \right] \tag{2}$$

In formula (2), $J_n(Z)$ is an n-order Bessel function of the first kind.

Figure 3:
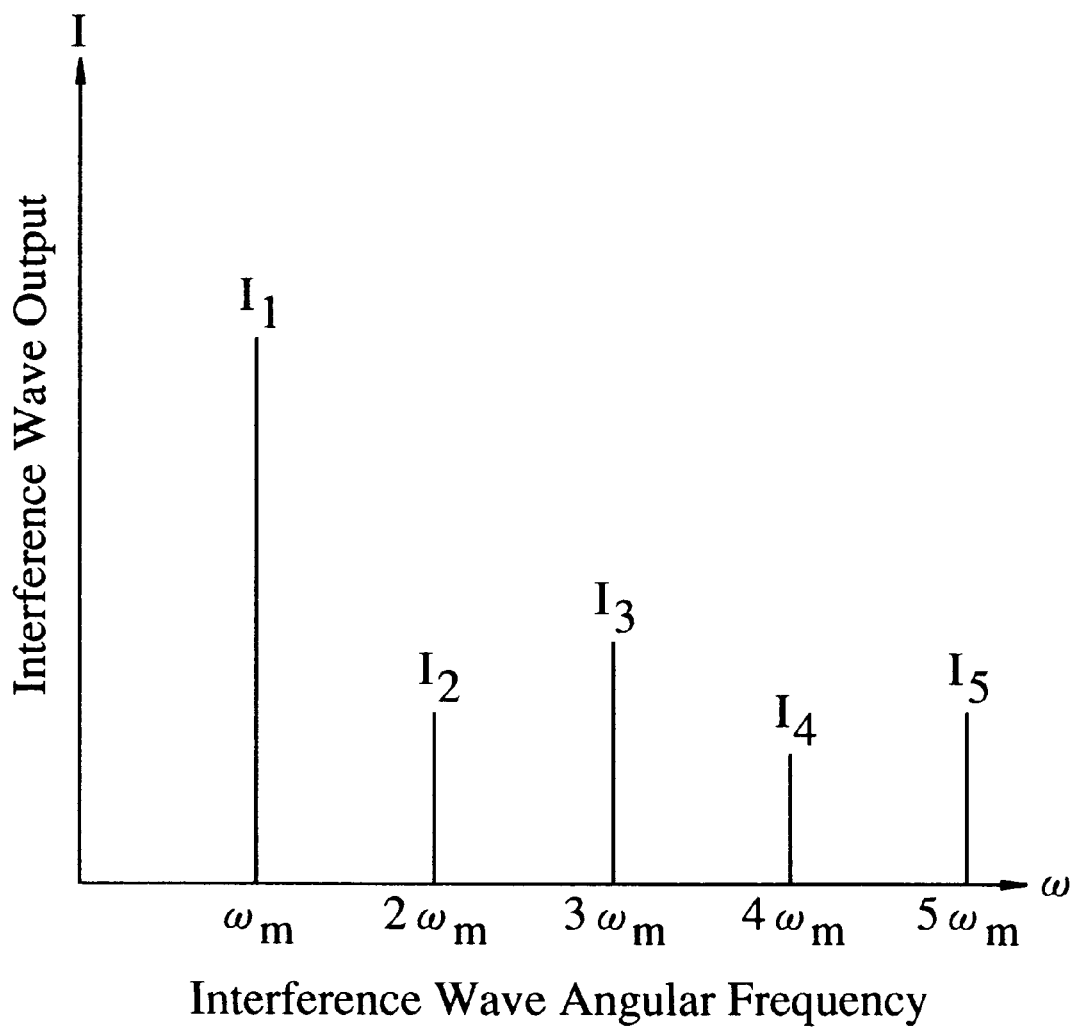

FIG. 3 is a graph of formula (2). In this figure, the horizontal axis shows the angular frequency $\omega$ of the interference wave and the vertical axis shows the output of the interference wave. As understood from the figure, when the driving current is sine wave modulated within any of the ranges $A_1$, $A_2$, ..., the interference wave output has a high frequency component $I_1$, $I_2$, $I_3$, ... corresponding to the angular frequency $\omega = \omega_m$, $2\omega_m$, $3\omega_m$, ....

Figure 4:
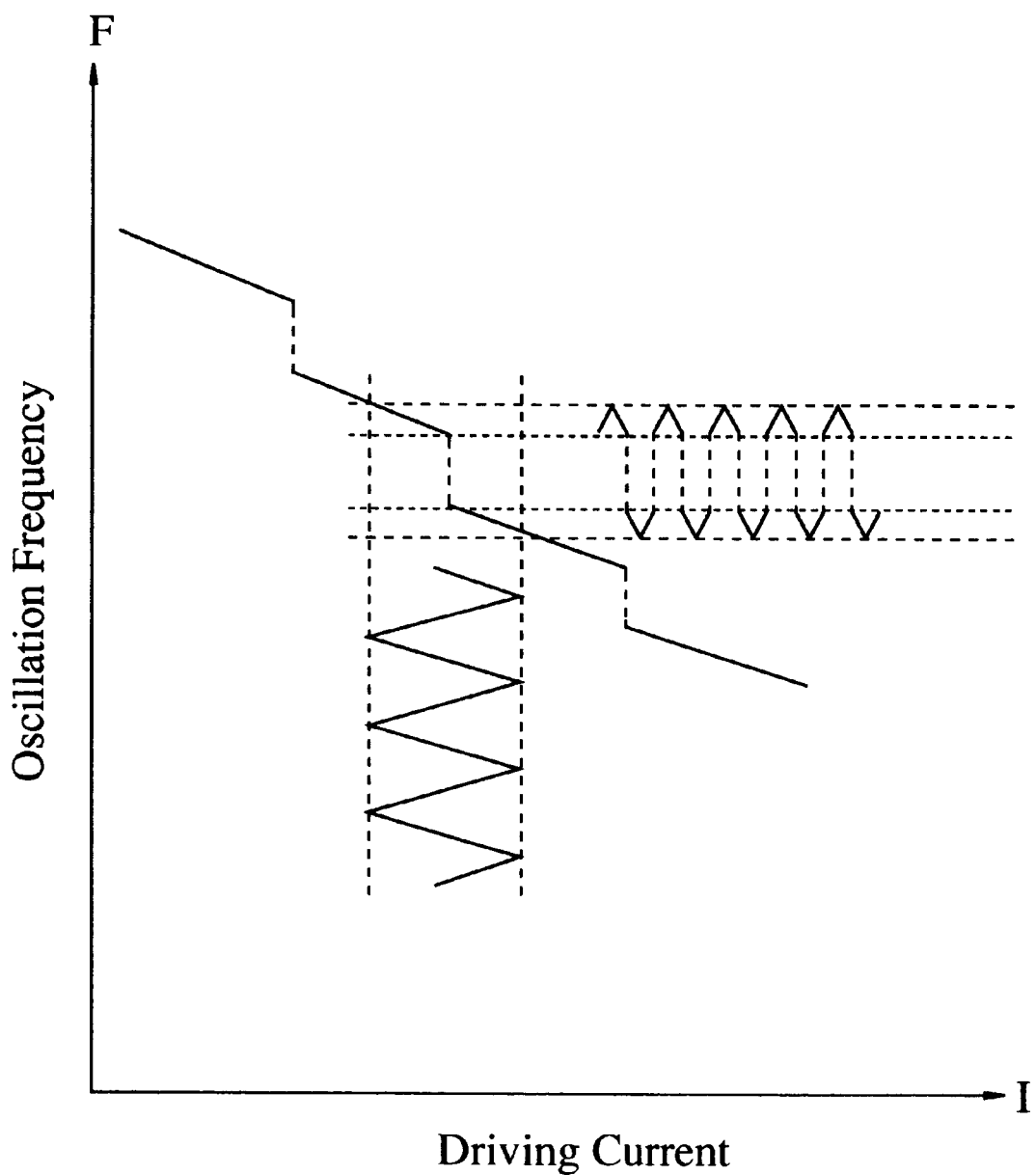

On the other hand, as shown in FIG. 4, the oscillation frequency of the semiconductor laser 100 is not sine wave modulated when the modulation frequency generating portion 110 performs sine wave modulation of the driving current supplied to the semiconductor laser 100 within any of the ranges $B_1$, $B_2$, $B_3$, ... (see FIG. 5). For this reason, the formula (1) is not established in the case as shown in FIG. 4 and consequently, the high frequency component $I_1$, $I_2$, $I_3$, . . . of the interference wave output is not generated (see FIG. 3).

Consequently, by determining whether the high frequency component $I_1, I_2, I_3$, . . . of the interference wave output is generated, it can be determined whether the driving current varies within any of the ranges $A_1, A_2$, . . . or within any of the ranges including $B_1, B_2, B_3$, . . . .

Actually, it is not necessary to extract all of the high frequency components $I_1, I_2, I_3$, . . . shown in FIG. 3 in order to distinguish whether the high frequency component is generated. For example, the aforementioned determination may be made by extracting the sum $I_{12}$ of a first high frequency component $I_1$ and a second high frequency component $I_2$ and using this value $I_{12}$. Here, $I_{12}(=I_1+I_2)$ can be expressed with formula (3).

$$I_{12}=2I_0 \cdot J_2(Z) \cos \phi + 2I_0 J_3(Z) \sin \phi \qquad (3)$$

This value $I_{12}$ becomes the maximum value when the driving current varies within any of the ranges $A_1, A_2$, . . . and the minimum value when the driving current varies within any of the ranges $B_1, B_2, B_3$, . . . . Consequently, the driving current of the semiconductor laser 100 can be caused to vary only within the ranges $A_1, A_2$, . . . (see FIG. 5) by extracting $I_{12}$ with the high frequency component detecting portion 150 and controlling the bias current with the bias current applying portion 160 so that $I_{12}$ becomes the maximum.

In this way, with this embodiment, the frequency modulation used for the semiconductor laser 100 can be realized just by controlling bias current so that the high frequency component of the interference beam attained with the optical system 130 becomes the maximum.

Also, the driving apparatus is easily made small in size and low cost, because the optical system 130 is constituted to be able to attain the interference beam with a simple constitution.

Moreover, in this embodiment, the first half-silvered mirror 132 is positioned so that the reflecting surface T, contacts the exit surface of the cube mirror 131 and the second half-silvered mirror 133 is positioned so that the surface opposite to the reflecting surface $T_2$ contacts the exit surface of the cube mirror 131. However, the first half-silvered mirror 132 may also be positioned so that the surface opposite the reflecting surface T, contacts the exit surface of the cube mirror 131 and the second half-silvered mirror 133 positioned so that the reflecting surface $T_2$ contacts the exit surface of the cube mirror 131.

Also, the laser beam $P_3$ which passed through the first half-silvered mirror 132 is the frequency modulated wave output, but the beam (not pictured) which passed through the second half-silvered mirror 133 may also be the frequency modulated wave output.

What is claimed is:

1. A driving apparatus for a semiconductor laser, comprising:

means for generating modulation frequency to supply driving current to a semiconductor laser in order to control the frequency modulation of a laser beam output by said semiconductor laser;

an interference optical system to cause said laser beam to split into two laser beams for measurement and to guide said two laser beams for measurement so as to mutually interfere after passing through optical paths with different optical lengths;

means for detecting light to detect the light intensity of said laser beams for measurement after interference;

means for detecting high frequency component to detect a high frequency component from the detection signal of said means for detecting light; and means for applying bias current to control the bias current applied to said driving current so that the light intensity of said high frequency component, detected by the means for detecting high frequency component, becomes the maximum value.

2. The driving apparatus for a semiconductor laser according to claim 1, wherein said interference optical system comprises:

a cube mirror for causing said incident laser beam to split into a straight beam and reflected beam at right angles to the straight beam;

a first half-silvered mirror mounted on the cube mirror so that said straight beam is reflected at angles of 180° by the junction plane with said cube mirror; and a second half-silvered mirror mounted on the cube mirror so that said reflected beam is reflected at angles of 180° by the surface opposite the junction plane with said cube mirror.

3. The driving apparatus for a semiconductor laser according to claim 2, wherein the thickness of said first half-silvered mirror is the same as the thickness of said second half-silvered mirror.

4. The driving apparatus for a semiconductor laser according to claim 2, wherein said laser beam which passed through said first half-silvered mirror is used as the frequency modulated wave output.

5. The driving apparatus for a semiconductor laser according to claim 2, wherein said laser beam which passed through said second half-silvered mirror is used as the frequency modulated wave output.

6. The driving apparatus for a semiconductor laser according to claim 1, wherein said interference optical system comprises:

a cube mirror for causing said incident laser beam to split into a straight beam and a reflected beam at right angles to the straight beam;

a first half-silvered mirror mounted on the cube mirror so that said straight beam is reflected at angles of 180° by the surface opposite the junction plane with said cube mirror; and a second half-silvered mirror mounted on the cube mirror so that said reflected beam is reflected at angles of 180° by the junction plane with said cube mirror.

7. The driving apparatus for a semiconductor laser according to claim 6, wherein the thickness of said first half-silvered mirror is the same as the thickness of said second half-silvered mirror.

8. The driving apparatus for a semiconductor laser according to claim 6, wherein said laser beam which passed through said first half-silvered mirror is used as the frequency modulated wave output.

9. The driving apparatus for a semiconductor laser according to claim 6, wherein said laser beam which passed through said second half-silvered mirror is used as the frequency modulated wave output.

10. The driving apparatus for a semiconductor laser according to claim 1, wherein said means for detecting high frequency component extracts only part of the high frequency component included in said detection signal.

11. Method for controlling driving of a semiconductor laser, comprising the steps of:

supplying driving current in sine wave form to a semiconductor laser;

causing a laser beam, output by said semiconductor laser, to split into two laser beams for measurement and for guiding said two laser beams for measurement so as to mutually interfere after passing through optical paths with different optical lengths;

detecting light intensity of said laser beams for measurement after interference with means for detecting light;

detecting high frequency component from said detection signal of said means for detecting light; and controlling bias current applied to said driving current so that the light intensity of said high frequency component becomes a maximum value.

12. The method for controlling driving of a semiconductor laser according to claim 11, wherein the process for detecting said high frequency component extracts only part of the high frequency component contained in said detection signal.

* * * * *